United States Patent
Kani et al.

(10) Patent No.: US 11,552,053 B2
(45) Date of Patent: Jan. 10, 2023

(54) MINIATURIZATION OF OPTICAL SENSOR MODULES THROUGH WIREBONDED BALL STACKS

(71) Applicant: Apple Inc., Cupertino, CA (US)

(72) Inventors: Bilal Mohamed Ibrahim Kani, Singapore (SG); Kishore N. Renjan, Singapore (SG); Kyusang Kim, Singapore (SG); Manoj Vadeentavida, Singapore (SG); Pierpaolo Lupo, Singapore (SG); Praveesh Chandran, Singapore (SG)

(73) Assignee: Apple Inc., Cupertino, CA (US)

( * ) Notice: Subject to any disclaimer, the term of this patent is extended or adjusted under 35 U.S.C. 154(b) by 244 days.

(21) Appl. No.: 16/912,000

(22) Filed: Jun. 25, 2020

(65) Prior Publication Data
US 2021/0405313 A1 Dec. 30, 2021

(51) Int. Cl.
| | | |
|---|---|---|
| H01L 25/065 | (2006.01) | |
| G02B 6/38 | (2006.01) | |
| G02B 6/36 | (2006.01) | |
| H01L 23/00 | (2006.01) | |
| H01L 25/16 | (2006.01) | |
| G02B 6/42 | (2006.01) | |

(52) U.S. Cl.
CPC ........ *H01L 25/0657* (2013.01); *G02B 6/3612* (2013.01); *G02B 6/3873* (2013.01); *G02B 6/3889* (2013.01); *H01L 24/43* (2013.01); *H01L 25/167* (2013.01); *G02B 6/4284* (2013.01); *H01L 2224/43821* (2013.01)

(58) Field of Classification Search
CPC .. H01L 25/167; H01L 25/043; H01L 25/0657
See application file for complete search history.

(56) References Cited

U.S. PATENT DOCUMENTS

| | | | |
|---|---|---|---|
| 7,378,645 B2 | 5/2008 | Mihara et al. | |
| 8,115,293 B2 * | 2/2012 | Moon | H01L 25/0657 257/723 |
| 9,082,636 B2 | 7/2015 | Lin et al. | |
| 9,935,148 B2 | 4/2018 | Yiu et al. | |
| 10,177,119 B2 | 1/2019 | Zhang et al. | |
| 10,203,398 B2 | 2/2019 | Chen | |
| 2012/0018754 A1 * | 1/2012 | Lowes | G02F 1/1334 257/E33.059 |
| 2013/0270682 A1 | 10/2013 | Hu et al. | |
| 2016/0148987 A1 | 5/2016 | Popp et al. | |
| 2016/0315071 A1 | 10/2016 | Zhai et al. | |
| 2017/0229426 A1 | 8/2017 | Hung et al. | |
| 2019/0148342 A1 | 5/2019 | Hu et al. | |
| 2020/0273840 A1 | 8/2020 | Elsherbini et al. | |
| 2020/0344869 A1 | 10/2020 | So et al. | |
| 2021/0098380 A1 | 4/2021 | Chen et al. | |

FOREIGN PATENT DOCUMENTS

JP 2009260165 A 11/2009

* cited by examiner

*Primary Examiner* — Tucker J Wright
(74) *Attorney, Agent, or Firm* — Aikin & Gallant, LLP

(57) ABSTRACT

Optical sensor modules and methods of fabrication are described. In an embodiment, an optical component is mounted on a module substrate. In an embodiment, a pillar of stacked wireballs adjacent the optical component is used for vertical connection between the module substrate and a top electrode pad of the optical component.

19 Claims, 5 Drawing Sheets

MINIATURIZATION OF OPTICAL SENSOR MODULES THROUGH WIREBONDED BALL STACKS

BACKGROUND

Field

Embodiments described herein relate to microelectronic packaging, and more specifically to optical module packages.

Background Information

As microelectronic devices become increasingly smaller and more portable, sensors are increasingly being incorporated in order to detect the environment or context associated with use of the devices. Among such sensors include light sensors or proximity sensors, which can detect ambient light or proximity to a target object such as a user's ear or face. In one implementation a proximity sensor can include a light source and photodetector (PD). In application, the PD may detect proximity to a target object by measuring the amount of light from the light source.

SUMMARY

Optical sensor modules and methods of fabrication are described in which a pillar of stacked wireballs adjacent an optical component is used for vertical connection between a module substrate and a top electrode pad of the optical component. In an embodiment, an optical sensor module includes a module substrate including a landing pad, an optical component (e.g. PD, emitter) mounted on the landing pad, and a pillar of stacked wireballs on the module substrate and adjacent the optical component. A molding compound layer can be formed on the module substrate to laterally surround the pillar and the optical component on the module substrate, and a wiring layer is formed over the molding compound layer to connect the pillar and a top electrode pad of the optical component. The wiring layer can be formed using various techniques that may achieve a low z height profile, including low loop wire bonding and deposition.

DETAILED DESCRIPTION

Figure 1:
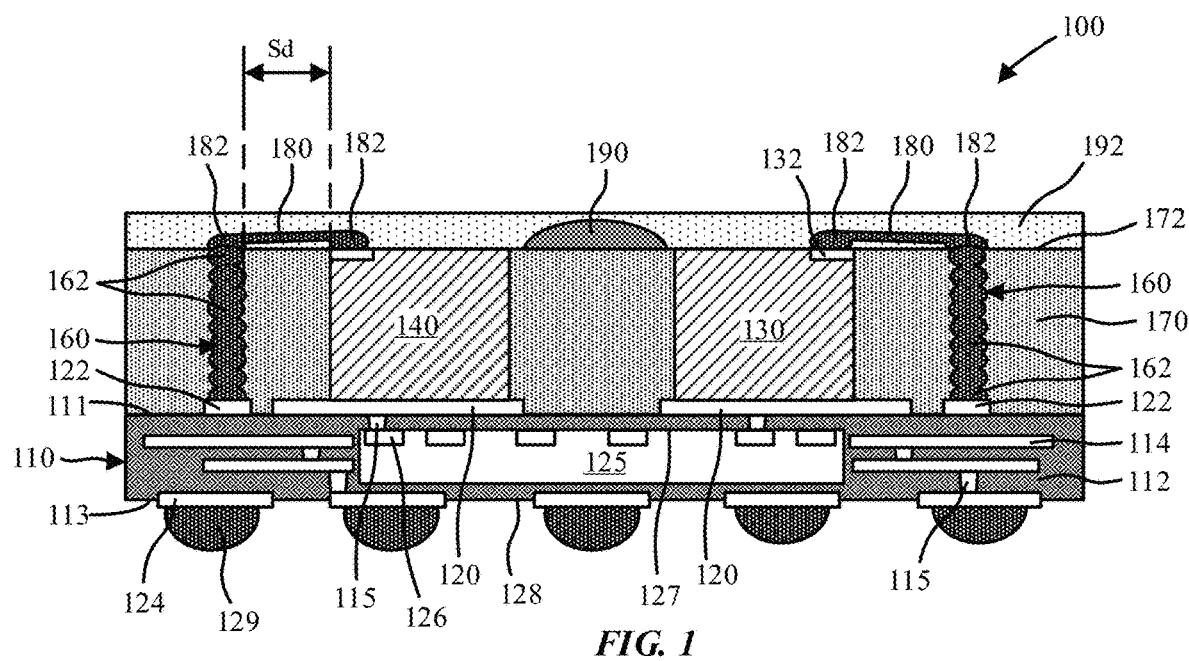
FIG. 1 is a schematic cross-sectional side view illustration of an optical sensor module including pillars of stacked wireballs in accordance with an embodiment.

Embodiments describe optical sensor modules and methods of fabrication. In particular, the optical sensor modules may be incorporated as light sensors or proximity sensors in portable electronic devices. In one aspect, the optical sensor modules in accordance with embodiments embed a controller chip along with one or more photodetectors (PDs) and one or more emitters in a single module. For example, the photodetectors may be photodiodes, and the emitters may be light emitting diodes. The controller chip may function to control operation of the one or more PDs and emitters. For example, the controller chip can be an application specific integrated circuit (ASIC) or field-programmable gate array (FPBA).

In one aspect the optical sensor module packages and methods of fabrication in accordance with embodiments provide an alternative layout and form factor compared to traditional optical sensor modules. For example, it has been observed that traditional optical sensor modules for proximity sensors mount the PD and light source onto a flex circuit. This end of the flex circuit can be mounted to a housing, while the opposite end of the flex circuit is routed to a controller on a circuit board located elsewhere in the housing. It has been observed that such a configuration can be particularly susceptible to mechanical shock, and also take up considerable space.

In accordance with embodiments, the optical sensor modules may utilize wire bonded ball stacks, also referred to as pillars of stacked wireballs, to reduce volume of the optical sensor modules as part of miniaturization. Furthermore, the pillars of stacked wireballs may provide additional x-y width and z height saving compared to traditional connection techniques such as wirebonding or printed circuit board (PCB) bars. The pillars of stacked wireballs can also be formed to match optical component (e.g. PD, emitter) height and avoid exposure to harmful chemicals associated with formation of pillars using alternative pillar (via) first or pillar (via) last approaches. This reduction may create space for adding more modules and functionalities when integrated into portable and wearable electronics, for example, where space can be limited.

Mechanical shock can also be mitigated in accordance with embodiments by embedding the multiple components into a single module, rather than having multiple components connected on opposite ends of a flex circuit. Furthermore, the optical sensor module packages in accordance with embodiments may be considered a system-in-package which allows for standalone testing and calibration.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of an optical sensor module 100 in accordance with an embodiment. As shown, the optical sensor module 100 may include a module substrate 110 including one or more dielectric layers 112 and routing layers 114 and vias 115. Module substrate 110 may be a variety of suitable substrates, such as a printed circuit board (PCB), which may be rigid or flexible, cored or coreless. The module substrate 110 may include a top side 111 with a plurality of landing pads 120, 122, and a bottom side 113 with a plurality of landing pads 124. In an embodiment, the bottom side landing pads 124 may be ball grid array (BGA) pads, for example, to accept solder balls 129, for example for subsequent mounting to another component, such as motherboard. The top side landing pads 120, 122 may be surface mount (SMT) pads, for example.

In the illustrated embodiment, the module substrate 110 may optionally include an embedded controller chip 125 to control operation of the one or more PDs and emitters. For example, the controller chip 125 can be an application specific integrated circuit (ASIC) or field-programmable gate array (FPBA). As shown, the controller chip 125 may be mounted face up in the module substrate 110 with contact pads 126 on a front side 127 of the controller chip 125 facing the optical components. The back side 128 of the controller chip 125 may optionally not include any contact pads. As shown, the contact pads 126 may be connected to routing layers 114 or vias 115 within the module substrate 110.

Still referring to FIG. 1, one or more PDs 130 and one or more emitters 140 can be mounted onto landing pads 120. Additionally, one or more pillars 160 of stacked wireballs 162 can be formed on landing pads 122 adjacent to the corresponding landing pads 120. The pillars 160 of stacked wireballs 162 can be formed of a variety of materials, including typical wire materials (e.g. including metals, and metal alloys) for wirebonding such as copper, aluminum, gold, silver, platinum, and various alloys thereof, etc. Sizing of the pillars stacked wireballs 162 may depend upon width/diameter of the bond wire selected. In an illustrative example, the individual stacked wireballs 162 have a width of 50-100 μm, or more specifically approximately 100 μm, and thickness/height of 25-100 μm, or more specifically approximately 50 μm. In an embodiment, the optical components and corresponding pillars have approximately a same height, and may be greater than 200 μm tall in some embodiments.

The one or more pillars 160 and optical components (e.g. PD(s) 130, emitter(s) 140) can then be encapsulated in a molding compound layer 170, which can be any suitable molding compound material. As shown, the molding compound layer 170 laterally surrounds the pillar(s) 160 and the optical component(s) on the module substrate 110. Wiring layers 180 may then be used to connect the pillars 160 to the corresponding top electrode pads 132, 142 of the corresponding optical components. The wiring layers 180 may be metal bond wires, or deposited layers. For example, wiring layer 180 can be formed by wire bonding a bond wire to the pillar 160 and top electrode pad 132, 142. This may be visualized with terminal stud bumps 182. The bond wire forming wiring layer 180 may be formed of the same material as the stacked wireballs 162, though they may be different materials. Where wire bonding is utilized, the metal bond wire can be looped above a top surface 172 of the molding compound layer 170. This may be a low loop structure, with less z height compared to a traditional wire loop. In an embodiment, the metal wire for the low loop structure can also be partially formed on the top surface 172 of the molding compound layer 170. Alternatively, the wiring layer 180 may be formed using a deposition technique, such as a physical deposition technique or application of conductive spray, slurry, or paste followed by heating to drive off residual liquid. Heating may also be used to anneal, coalesce deposited conductive particles in the wiring layer 180. In such a fabrication method, the wiring layer may be formed on (e.g. directly on) the top surface 172 of the molding compound layer 170 if no intervening layers are present.

An opaque material 190, such as a black matrix material, may optionally be formed on top of the molding compound layer 170 laterally between the optical components (e.g. between the PD 130 and emitter 140). For example, this can mitigate cross-talk between the PD(s) 130 and emitter(s) 140. A transparent encapsulation material 192 can then be formed over the wiring layer 180 and the optical components, and optionally the opaque material 190. In the embodiment illustrated, a single transparent encapsulation material 192 layer is formed, though separate layers may be formed.

Figure 2:
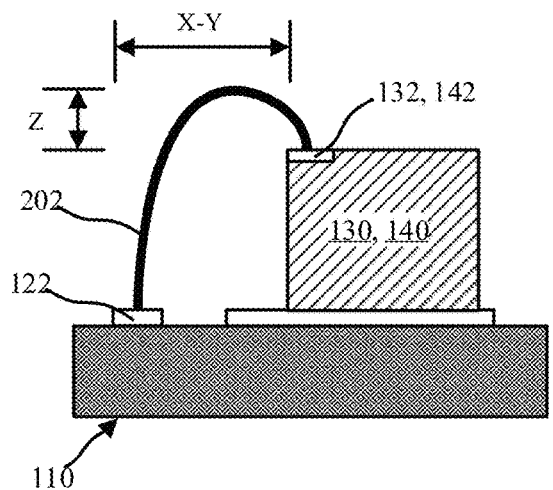
FIG. 2 is a schematic cross-sectional side view illustration showing x-y width and z height associated with a wire bond connection.
Figure 3:
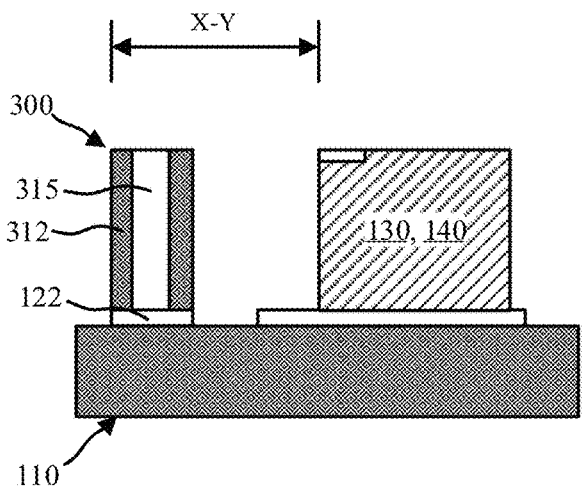
FIG. 3 is a schematic cross-sectional side view illustration showing x-y width associated with a PCB bar connection.

In accordance with embodiments, the pillars 160 may be formed with a stand-off distance (Sd) of less than 50 μm from an adjacent optical component, or more specifically less than 30 μm. Furthermore, the pillars 160 can be stand-alone structures that are not encapsulated other than with the molding compound layer 170. This can contribute to overall module x-y area reduction. Furthermore, the pillars 160 can be formed to have an approximately equivalent height as the adjacent optical component. Furthermore, the ability to use low-loop wirebonding or deposition techniques for the formation of the wiring layer 180 can further contribute to a reduction of z height. Thus, the pillars 160 and wiring layers 180 can be formed to necessary height, without exposing the module components to harmful chemicals and processes, with overall x-y area and z-height reduction. This is illustrated in FIGS. 2-3. FIG. 2 is a schematic cross-sectional side view illustration showing x-y width and z height associated with a wire bond connection. As shown, a typical wire 202 used to connect the top electrode pad 132, 142 of an optical component to landing pad 122 may have an increase in both x-y area, and z height compared to the electrical connection in accordance with embodiments. FIG. 3 is a schematic cross-sectional side view illustration showing x-y width associated with a PCB bar 300 connection. As shown, such a PCB bar 300 may include a vertical via 315 within an insulating layer 312, which contributes to overall x-y width. Furthermore, placement tolerances and insulating layer 312 may also contribute to an increased stand-off distance between the via 315 and optical component compared to the electrical connection in accordance with embodiments.

Figure 4:
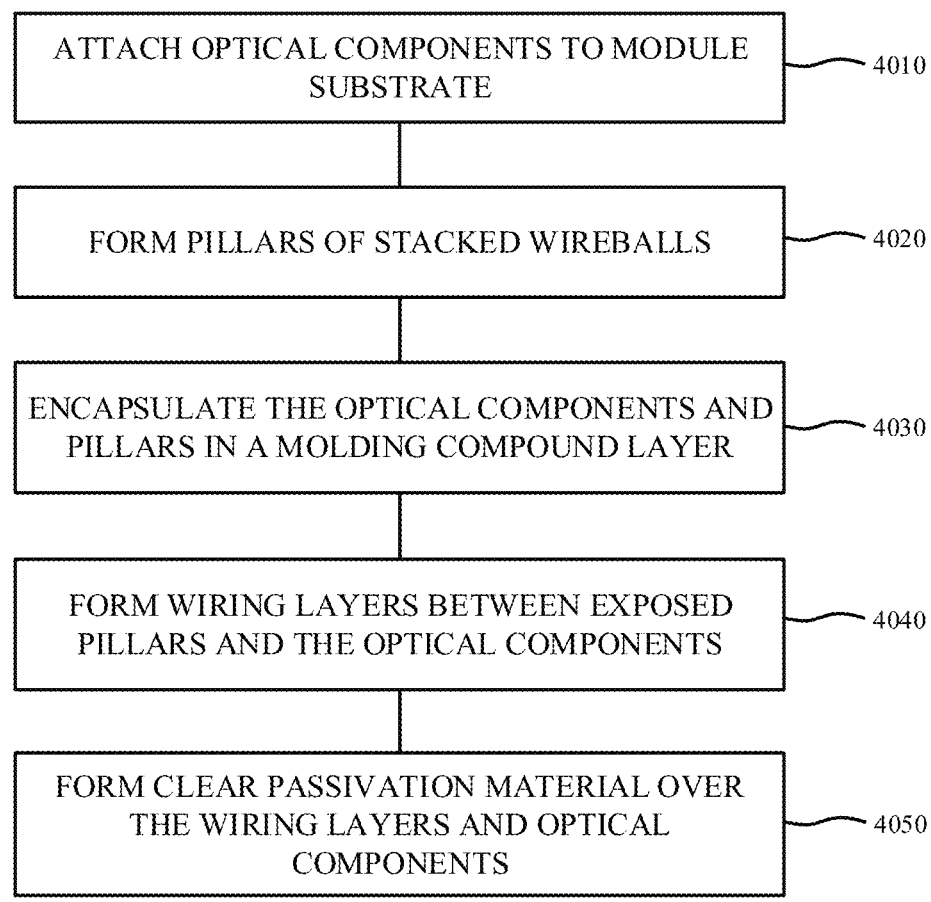
FIG. 4 is a flow diagram for a method of assembling an optical sensor module in accordance with an embodiment.

FIG. 4 is a flow diagram for a method of assembling an optical sensor module such as that illustrated in FIG. 1 in accordance with an embodiment. FIGS. 5A-5H are schematic cross-sectional side view illustrations of a method of forming an optical sensor module such as that illustrated in FIG. 1 in accordance with an embodiment. In interest of clarity and conciseness, the structures and process flow of FIGS. 4 and 5A-H are described together in the following description.

Figure 5A:
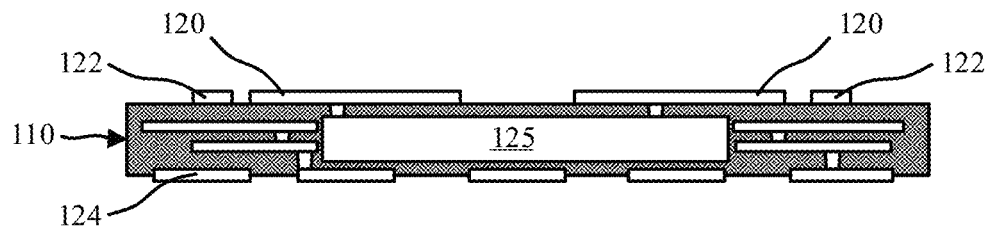
FIGS. 5A-5H are schematic cross-sectional side view illustrations of a method of forming an optical sensor module in accordance with an embodiment.
Figure 5B:
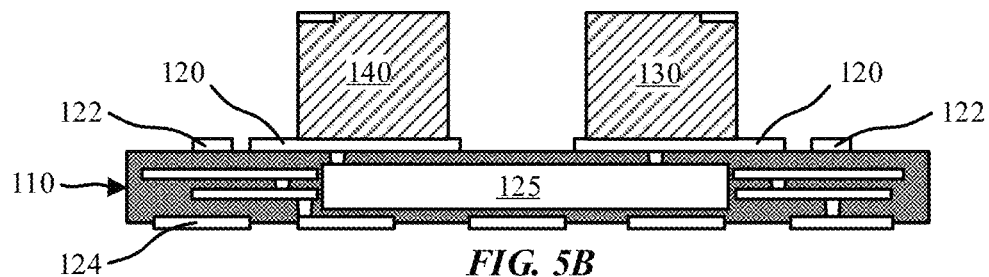

Referring to FIG. 5A, the process sequence can begin with the module substrate 110, which may optionally include an embedded controller chip 125 as described with regard to FIG. 1. At operation 4010 the optical components, including one or more PDs 130 and one or more emitters 140 are attached to, or mounted on, the module substrate 110 as shown in FIG. 5B. Specifically, the optical components may include bottom electrodes that are mounted on, and in electrical contact with the landing pads 120 of the module substrate 110.

Figure 5C:
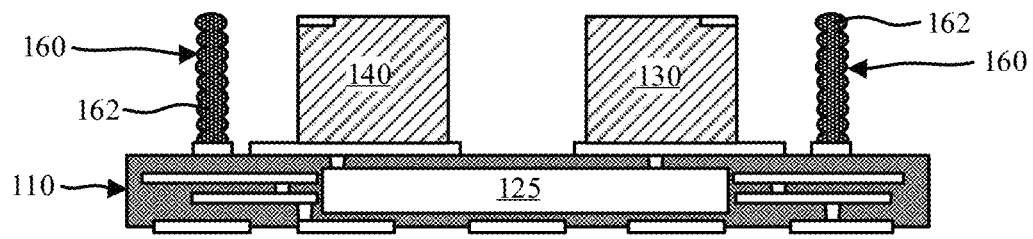

Referring now to FIG. 5C, the pillars 160 of stacked wireballs 162 are then formed at operation 4020. In an embodiment this includes sequentially forming each stacked wireball 162 of the stacked wireballs from a first wire. For example, the first wire (e.g. metal) may be formed of copper, aluminum, gold, silver, platinum, and various alloys thereof, etc. In the particular sequence illustrated the pillars 160 are formed after the placement of the optical components. This may be attributed to the pillars 160 being a more fragile structure. However, it is contemplated pillars 160 could be formed prior to placement of the optical components.

Figure 5D:
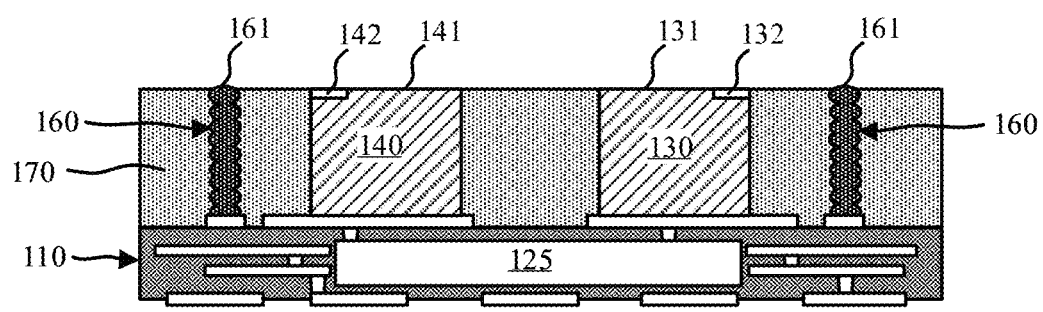
Figure 5E:
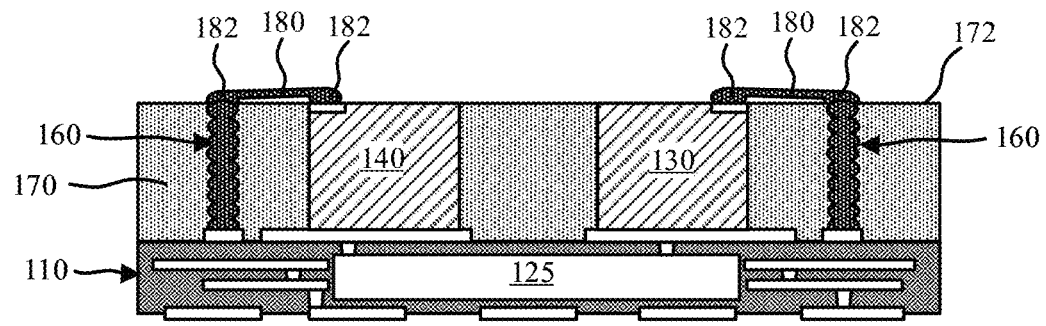

Once the optical components have been placed, and pillars 160 are formed, they are then encapsulated in a molding compound layer 170 at operation 4030, as illustrated in FIG. 5D. As shown, the molding process may leave the top sides 161 of the pillars 160 exposed, and top sides 131, 141 of the optical components exposed, including top electrode pads 132, 142. Wiring layers 180 are then formed between the exposed pillars 160 and optical components at operation 4040, as illustrated in FIG. 5E. In the particular embodiment illustrated, wiring layers 180 are shown as a low loop formation, in which a metal wire is looped above the top surface 172 of the molding compound layer 170. For example, the metal wire may be substantially straight between terminal stud bumps 182 formed of the metal wire on the top sides 161 of the pillars 160 and on the top electrode pads 132, 142. The metal wire may optionally partially rest on the top surface 172 of the molding compound layer 170. The metal wire may be formed of the same material (e.g. metal, alloy) as the wire used to form the pillars 160, or may be formed of a different material, which can be any of the materials from which the first wire (used to form the pillars 160) is made.

In accordance with embodiments, the wiring layers 180 can be formed using a deposition technique, such as a physical deposition technique or application of conductive spray, slurry, or paste followed by heating to drive off residual liquid. Heating may also be used to anneal, coalesce deposited conductive particles in the wiring layer 180. In such a fabrication method, the wiring layer may be formed on (e.g. directly on) the top surface 172 of the molding compound layer 170 if no intervening layers are present.

Figure 5F:
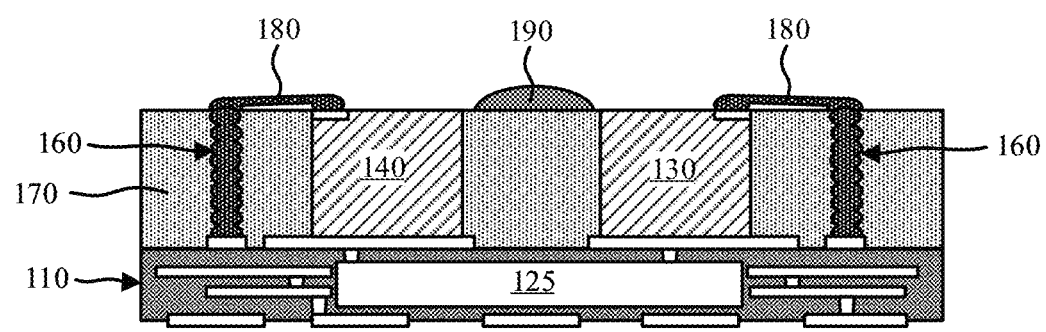
Figure 5G:
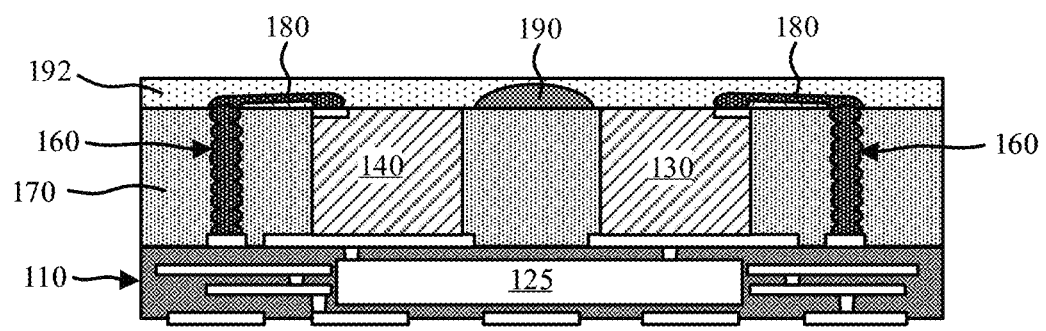
Figure 5H:
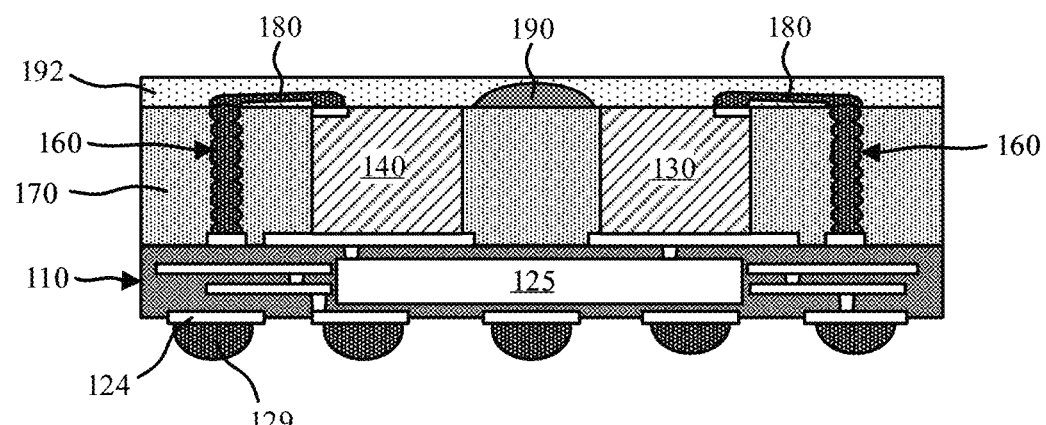

An opaque material 190, such as a black matrix material, may then optionally be formed on top of the molding compound layer 170 laterally between the optical components (e.g. between the PD 130 and emitter 140) as shown in FIG. 5F, followed by formation of a transparent passivation material 192 over the wiring layers 180 and optical components at operation 4050, as shown in FIG. 5G. This may include a single transparent passivation material 192 layer over the wiring layers 180, one or more PDs 130 and one or more emitters 140, or may include separate transparent passivation material 192 layers, for example for each pillar 160 and optical component pair. Solder balls 129 may then be applied to the bottom side landing pads 124, for subsequent mounting.

Figure 6A:
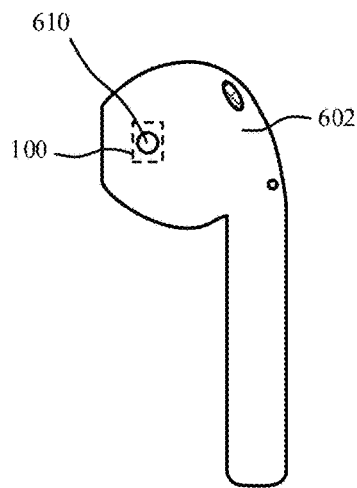
FIGS. 6A-6B are schematic side view illustrations of an earbud in accordance with an embodiment.
Figure 6B:
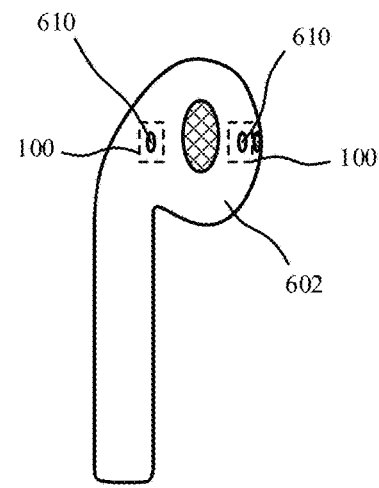
Figure 7:
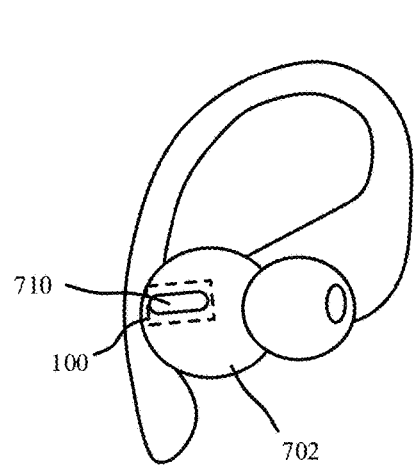
FIG. 7 is a schematic side view illustration of an earpiece in accordance with an embodiment.
Figure 8:
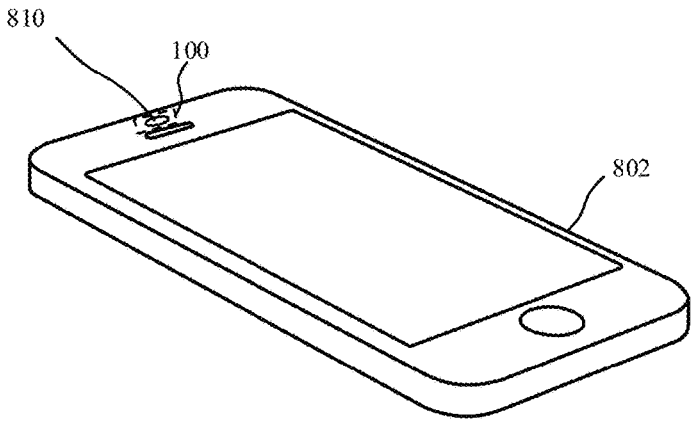
FIG. 8 is a schematic side view illustration of a mobile phone in accordance with an embodiment.

FIGS. 6A-8 illustrate various portable electronic devices in which the various embodiments can be implemented. FIGS. 6A-6B are schematic side view illustrations of an earbud in accordance with an embodiment that includes a housing 602 and one or more openings 610 to which the optical components (e.g. PD, emitter) of the optical sensor modules 100 described herein can be aligned adjacently. FIG. 7 is a schematic side view illustration of an earpiece in accordance with an embodiment that includes a housing 702 including an opening 710 to which the optical components (e.g. PD, emitter) of the optical sensor modules 100 described herein can be aligned adjacently. FIG. 8 is a schematic side view illustration of a mobile phone in accordance with an embodiment including a housing 802 including an opening 810 to which the optical components (e.g. PD, emitter) of the optical sensor modules 100 described herein can be aligned adjacently. These illustrations are intended to be exemplary and non-exhaustive implementations.

In utilizing the various aspects of the embodiments, it would become apparent to one skilled in the art that combinations or variations of the above embodiments are possible for forming an optical sensor module. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical sensor module comprising:
   a module substrate including a landing pad;
   an optical component mounted on the landing pad;
   a pillar of stacked wireballs adjacent the optical component;
   a molding compound layer laterally surrounding the pillar and the optical component on the module substrate; and
   a metal wire that is looped above a top surface of the molding compound layer and connecting the pillar and a top electrode pad of the optical component.

2. The optical sensor module of claim 1, further comprising a transparent encapsulation material over the metal wire and the optical component.

3. The optical sensor module of claim 1, wherein the module substrate comprises an embedded controller chip.

4. The optical sensor module of claim 1, wherein the stacked wireballs and the metal wire are formed of a same material.

5. The optical sensor module of claim 1, wherein a lateral stand-off distance between the pillar and the optical component is less than 30 μm.

6. The optical sensor module of claim 1, wherein the pillar is greater than 200 μm tall.

7. The optical sensor module of claim 1, wherein the optical component is a photodetector (PD), and further comprising:
   an emitter mounted on a second landing pad of the module substrate;
   a second pillar of stacked wireballs adjacent the emitter, wherein the molding compound layer laterally surrounds the emitter and the second pillar; and
   a second metal wire over the molding compound layer and connecting the second pillar and a second top electrode pad of the emitter.

8. The optical sensor module of claim 1, wherein the optical component is mounted adjacent an opening in a housing of portable electronic device.

9. An optical sensor module comprising:
a module substrate including a landing pad;
a photodetector (PD) mounted on the landing pad;
an emitter mounted on a second landing pad of the module substrate;
a pillar of stacked wireballs adjacent the PD;
a second pillar of stacked wireballs adjacent the emitter;
a molding compound layer laterally surrounding the pillar, the second pillar, and the PD, and the emitter on the module substrate;
a wiring layer over the molding compound layer and connecting the pillar and a top electrode pad of the PD; and
a second wiring layer over the molding compound layer and connecting the second pillar and a second top electrode pad of the emitter.

10. The optical sensor module of claim 9, wherein a lateral stand-off distance between the pillar and the PD is less than 30 μm.

11. The optical sensor module of claim 9, wherein the pillar is greater than 200 μm tall.

12. The optical sensor module of claim 9, wherein the PD is mounted adjacent an opening in a housing of portable electronic device.

13. An optical sensor module comprising:
a module substrate including a landing pad;
an optical component mounted on the landing pad;
a pillar of stacked wireballs adjacent the optical component;
wherein a lateral stand-off distance between the pillar and the optical component is less than 30 μm;
a molding compound layer laterally surrounding the pillar and the optical component on the module substrate; and
a wiring layer over the molding compound layer and connecting the pillar and a top electrode pad of the optical component.

14. The optical sensor module of claim 13, wherein the pillar is greater than 200 μm tall.

15. The optical sensor module of claim 13, wherein the optical component is mounted adjacent an opening in a housing of portable electronic device.

16. An optical sensor module comprising:
a module substrate including a landing pad and an embedded controller chip;
an optical component mounted on the landing pad;
a pillar of stacked wireballs adjacent the optical component;
a molding compound layer laterally surrounding the pillar and the optical component on the module substrate; and
a wiring layer over the molding compound layer and connecting the pillar and a top electrode pad of the optical component.

17. The optical sensor module of claim 16, further comprising a transparent encapsulation material over the wiring layer and the optical component.

18. The optical sensor module of claim 16, wherein the pillar is greater than 200 μm tall.

19. The optical sensor module of claim 16, wherein the optical component is mounted adjacent an opening in a housing of portable electronic device.

* * * * *